(12) United States Patent
Chu et al.

(10) Patent No.: US 7,813,884 B2
(45) Date of Patent: Oct. 12, 2010

(54) METHOD OF CALCULATING POWER FLOW SOLUTION OF A POWER GRID THAT INCLUDES GENERALIZED POWER FLOW CONTROLLERS

(75) Inventors: Chia-Chi Chu, Tao-Yuan (TW);
Sheng-Huei Lee, Tao-Yuan (TW);
Chung-Hsiung Chen, Tao-Yuan (TW)

(73) Assignee: Chang Gung University, Tao-Yuan (TW)

( * ) Notice: Subject to any disclaimer, the term of this patent is extended or adjusted under 35 U.S.C. 154(b) by 376 days.

(21) Appl. No.: 12/013,629

(22) Filed: Jan. 14, 2008

(65) Prior Publication Data
US 2009/0182518 A1 Jul. 16, 2009

(51) Int. Cl.
*G01R 21/06* (2006.01)
(52) U.S. Cl. .................. 702/61; 702/117; 702/179; 702/188; 307/98; 307/99; 323/207; 323/282; 363/81
(58) Field of Classification Search .................. 702/58, 702/60, 64, 67, 75, 179, 180, 181, 117; 307/98, 307/99; 323/207, 282, 81
See application file for complete search history.

(56) References Cited
U.S. PATENT DOCUMENTS

| | | | | |
|---|---|---|---|---|
| 5,808,452 A | * | 9/1998 | Gyugyi et al. | 323/207 |
| 6,011,381 A | * | 1/2000 | Andrei | 323/215 |
| 6,025,701 A | * | 2/2000 | Weinhold | 323/207 |
| 6,411,065 B1 | * | 6/2002 | Underwood et al. | 322/20 |
| 6,414,853 B2 | * | 7/2002 | Buckles et al. | 363/14 |
| 6,498,464 B1 | * | 12/2002 | Doht et al. | 323/247 |
| 6,577,108 B2 | * | 6/2003 | Hubert et al. | 323/207 |
| 6,963,187 B2 | * | 11/2005 | Bebic et al. | 323/207 |

\* cited by examiner

*Primary Examiner*—Carol S Tsai (57) ABSTRACT

A method to incorporate the steady-state model of the generalized power flow controller into a Newton-Raphson power flow algorithm adopts a flexible steady-state model of the generalized power flow controller, which can be applied to calculate the power flow solution of a power grid embedded with STATCOM, UPFC, GUPFC and the generalized power flow controller in a single framework. The method only incorporates the control variables of the shunt voltage sourced converter into the state vector of the Newton-Raphson power flow algorithm. The increment of the state variables due to incorporating the generalized power flow controller is less than the prior art. Further, the method can preserve the quadratic convergence characteristic of the Newton-Raphson power flow algorithm after embedding the generalized power flow controller into a power grid.

6 Claims, 9 Drawing Sheets

Fig. 9

METHOD OF CALCULATING POWER FLOW SOLUTION OF A POWER GRID THAT INCLUDES GENERALIZED POWER FLOW CONTROLLERS

BACKGROUND OF THE INVENTION

1. Field of the Invention

The present invention relates generally to the power flow analysis of a power grid embedded with a generalized power flow controller in the technical field and, more particularly, to a method to incorporate the steady-state model of a generalized power flow controller into a conventional Newton-Raphson power flow algorithm, which can be applied to calculate the power flow solution of a power grid embedded with the generalized power flow controller.

2. Description of Related Art

In the last decade, the power industry has extensively employed an innovative Flexible Alternative Current Transmission System (FACTS) technology to improve the utilization of existing transmission facilities. Connecting several Voltage Sourced Converters (VSCs) together forms various multiple functional FACTS controllers, such as: Static Synchronous Compensator (STATCOM) 103, Unified Power Flow Controller (UPFC) 102, and Generalized Unified Power Flow Controller (GUPFC) 101.

Figure 1:
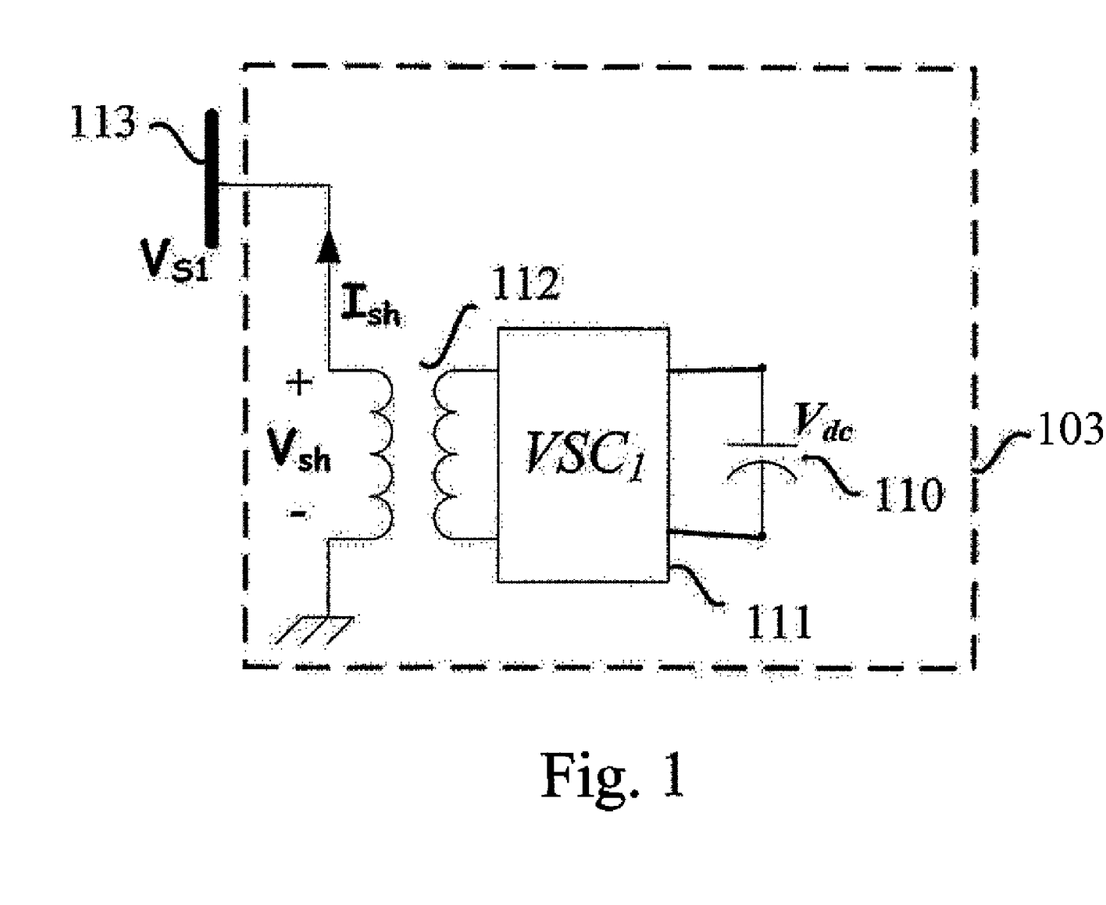
FIG. 1 is the interconnection of a STATCOM and a power grid according to the present invention.

The STATCOM, as shown in FIG. 1, has one shunt VSC. The AC side of the shunt VSC connects to a bus of a power grid through a coupling transformer, and the DC side connects to a capacitor. The STATCOM provides reactive power compensation to regulate the voltage magnitude of the connected bus at a fix level.

Figure 2:
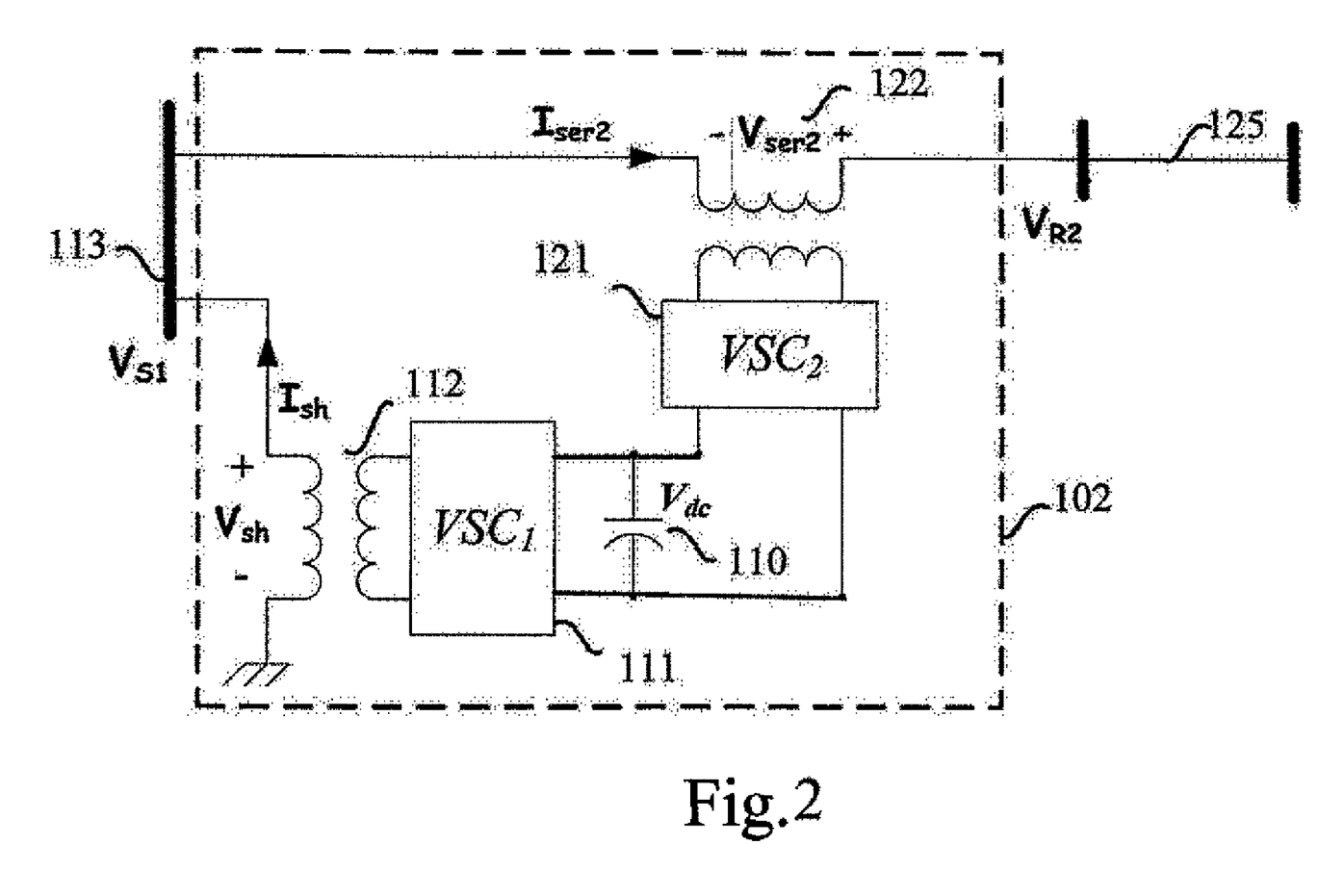
FIG. 2 is the interconnection of a UPFC 102 and a power grid according to the present invention.

The UPFC 102, as shown in FIG. 2, has one shunt VSC and one series VSC. The AC side of the shunt VSC connects to a bus through a shunt coupling transformer, whereas the AC side of the series VSC is in series with a transmission line through a series coupling transformer. The DC sides of the shunt and series VSCs share the same capacitor. The shunt VSC can regulate the voltage magnitude of the connected bus at a fixed level, and the series VSC can control the active and reactive power of the connected transmission line.

Figure 3:
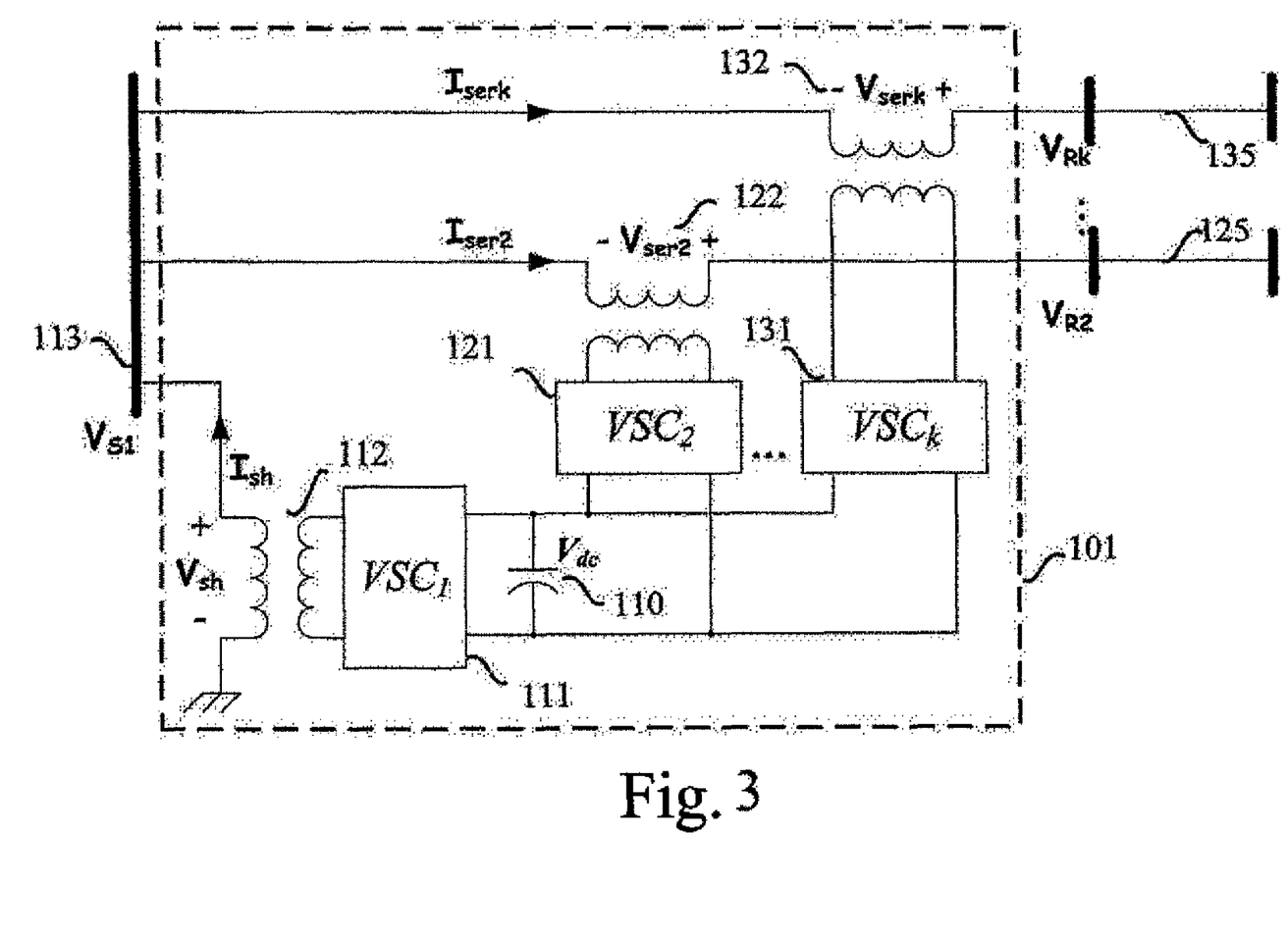
FIG. 3 is the interconnection of a GUPFC 101 and a power grid according to the present invention.

The GUPFC 101, as shown in FIG. 3, comprises one shunt VSC and a plurality of series VSCs. The connections and functions of the VSCs of the GUPFC 101 are like those in the UPFC 102. These VSCs enable the GUPFC 101 to control the voltage magnitude of the bus connected with the shunt VSC and to control the active and reactive power of each transmission line which is in series with the series VSC.

The disclosed generalized power flow controller has a more flexible structure than the GUPFC 101. Comparing FIG. 3 and FIG. 4, both the GUPFC 101 and the generalized power flow controller have one shunt branch and a plurality of series branches. In the GUPFC 101, the shunt branch and the receiving-end of each series branch connect to a common bus, bus $s_1$. However, in the disclosed generalized power flow controller, the shunt branch and the receiving-end of each series branch are allowed to connect to different buses, bus $s_1$, bus $s_2 \sim s_n$, respectively.

The versatility of the generalized power flow controller can be applied to equalize both the active and reactive power in the transmission lines, to relieve the overloaded transmission lines from the burden of reactive power flow, and to restore for declines in resistive as well as reactive voltage drops.

Developing a steady-state model of the generalized power flow controller is fundamentally important for a power flow analysis of a power grid embedded with the generalized power flow controller. The power flow analysis provides the information of impacts on a power system after installing the generalized power flow controller. Many steady-state models of STATCOM 103, UPFC 102 and GUPFC 101 applied to power flow analysis have been set forth. In 2000, a STATCOM 103 steady-state model accounting for the high-frequency effects and power electronic losses is proposed in an article "An improved StatCom model for power flow analysis", by Zhiping Yang; Chen Shen; Crow, M. L.; Lingli Zhang; in IEEE Power Engineering Society Summer Meeting, 2000, Volume 2, Page(s):1121-1126.

A conventional approach to calculate the power flow solution of a power grid that includes a unified power flow controller is disclosed in an article "Unified power flow controller: a critical comparison of Newton-Raphson UPFC algorithms in power flow studies" by C. R. Fuerte-Esquivel and E. Acha in IEE Proc. Generation, Transmission & Distribution, 1997, and in an article "A comprehensive Newton-Raphson UPFC model for the quadratic power flow solution of practical power network" by C. R. Fuerte-Esquivel, E. Acha and H. Ambriz-Perez in IEEE Trans. Power System, 2000. In 2003, X.-P. Zhang developed a method to incorporate a voltage sourced based model of the GUPFC 101 into a Newton-Raphson power flow algorithm in an article "Modeling of the interline power flow controller and the generalized unified power flow controller in Newton power flow", IEE Proceedings. Generation, Transmission & Distribution, Vol. 150, No. 3, May, 2003, pp. 268-274. The method included the voltage magnitude and phase angle of the equivalent voltage source into the state vector of Newton-Raphson iteration formula. The number of appended state variables is twice the number of VSCs. Thus, the length of the state vector is varied depending on the number of VSCs. Therefore, the prior art can only be applied to the case with a fixed number of VSCs. It can not be extended to the applications of STATCOM 103 and UPFC 102. Besides, the speed of convergence is sensitive to the initial values of the control variables of the GUPFC 101. The initial values of the control variables need a careful selection. Improper selection of the control variables may cause the solutions oscillating or even being divergent.

Although the steady-state models of STATCOM 103, UPFC 102 and GUPFC 101 have been widely discussed individually, a method to incorporate steady-state models of STATCOM 103, UPFC 102, GUPFC 101 and the generalized power flow controller into a Newton-Raphson power flow algorithm in a single framework have not been disclosed.

SUMMARY OF THE INVENTION

It is, therefore, an object of the present invention to provide a method to incorporate the steady-state model of a generalized power flow controller into a Newton-Raphson power flow algorithm with a robustness and rapid convergence characteristic, wherein the convergence speed is not sensitive to the selection of initial values of control variables of the generalized power flow controller.

It is another object of the present invention to provide a method to incorporate the steady-state model of the generalized power flow controller into a Newton-Raphson power flow algorithm, wherein the steady-state model has a flexible structure which can be applied to calculate the power flow solution of a power grid embedded With STATCOM 103, UPFC 102, GUPFC 101 and the generalized power flow controller in a single framework.

To carry out previously mentioned objects, an innovative steady-state model of the generalized power flow controller is disclosed. The steady-state model has a flexible structure, wherein the sending-end of each series VSC isn't confined to connect to the same bus as the shunt converter is connected. The feature of the steady-state model is expressing the variables of the steady-state model in a rectangular coordinate. Transforming the phasor from a conventional polar coordinate into d-q components reduces the appended state variables in the Newton-Raphson iteration. As a result, the increased iterations introduced by the generalized power flow controller is fewer than the prior art. The power flow calculation can preserve a rapid convergence characteristic.

In addition, a method to incorporate the steady-state model of the generalized power flow controller is disclosed. The method only incorporates the control variables of the shunt VSC into the state vector of Newton-Raphson power flow algorithm. The equivalent voltages of the series VSCs are calculated directly from the power flow control objectives and the bus voltages. Thus, the length of the state vector is the same regardless of the number of series VSCs. As a result, the present invention can be utilized to calculate the power flow solution of a power grid embedded with STATCOM 103, UPFC 102, GUPFC 101 and the generalized power flow controller.

The above and other objects and efficacy of the present invention will become more apparent after the description taken from the preferred embodiments with reference to the accompanying drawings is read.

DETAILED DESCRIPTION OF THE PREFERRED EMBODIMENT

Figure 4:
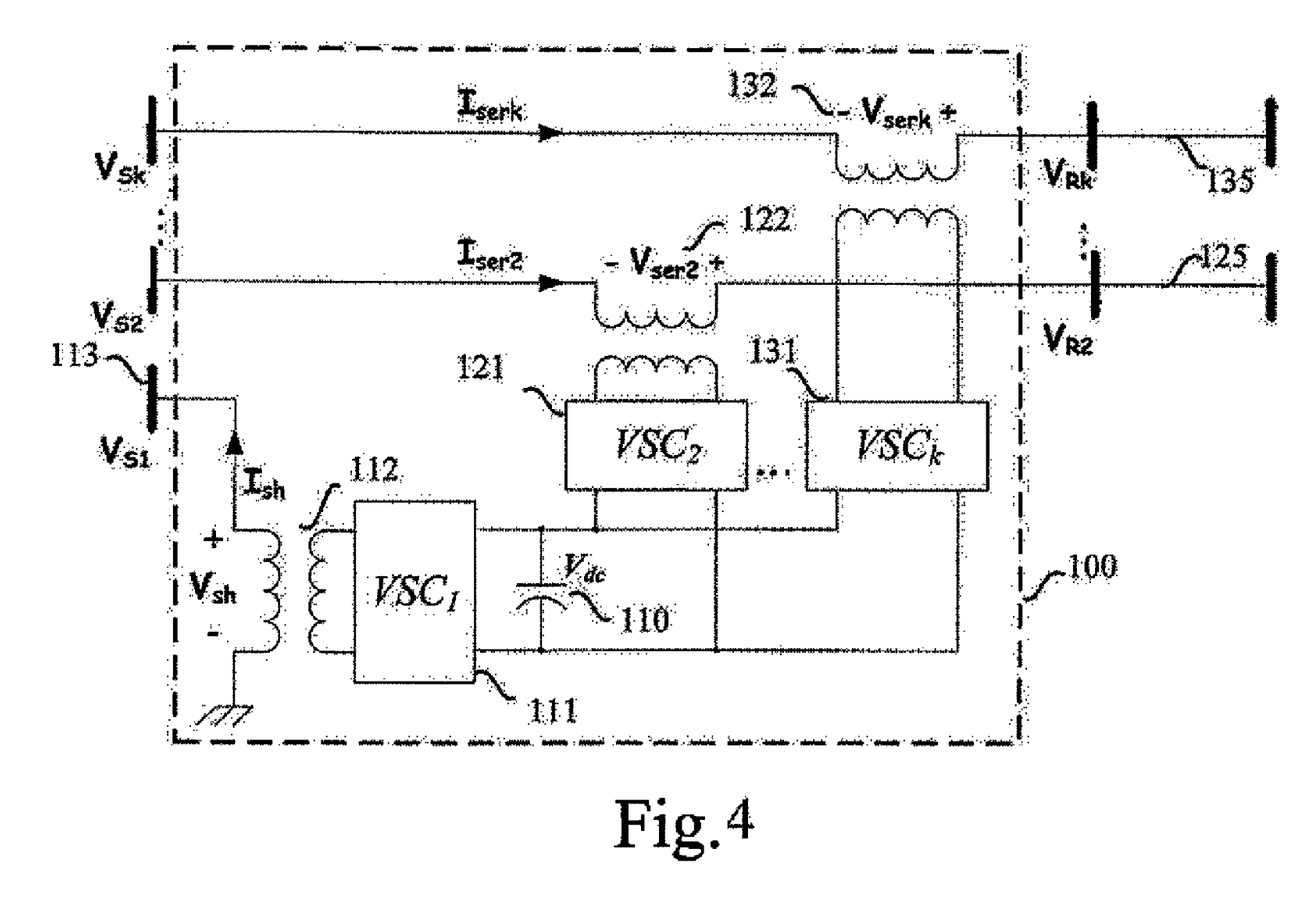
FIG. 4 is the interconnection of a generalized power flow controller and a power grid according to the present invention.

The generalized power flow controller 100 is a multi-functional FACTS controller. As depicted in FIG. 4, the generalized power flow controller comprises a plurality of voltage sourced converters (VSCs) 111, 121, 131 and a plurality of coupling transformers 112, 122, 132. These VSCs are connected back-to-back to share a common DC bus. The AC sides of the VSCs couple to a power grid through coupling transformers, and the DC sides of the VSCs link together to a DC coupling capacitor 110.

One of these VSCs, $VSC_1$ 111, connects to an AC bus $S_1$ 113 in parallel, and the other VSCs 121, 131 are coupled to transmission lines 125, 135 in series. These VSCs exchange active power via the common DC bus. The shunt VSC, $VSC_1$ 111, can provide the reactive power compensation to regulate the voltage magnitude at its connected AC bus $s_1$ 113, whereas each of the series VSCs, $VSC_2$-$VSC_n$, 121, 131, can provide both the active and reactive power compensation to concurrently control the active and reactive power of the connected transmission line 125, 135.

The main function of the $VSC_1$ 111 is to keep a fixed DC voltage at DC bus by balancing the active power transfer among the VSCs. The remaining capacity of the $VSC_1$ 111 is utilized to regulate the voltage magnitude at AC bus $s_1$113. In other words, the active power generated/absorbed by the $VSC_1$ 111 is restricted by the operation of the other VSCs. Thus, the $VSC_1$ 111 has only one control degree of freedom. It can provide the reactive power compensation to regulate the voltage magnitude of AC bus $s_1$ 113. On the other hand, each of the series VSCs, $VSC_2$-$VSC_n$ 121, 131, has two control degrees of freedom. It can simultaneously provide the active and reactive power compensation to control the active and reactive power in the transmission line.

Figure 5:
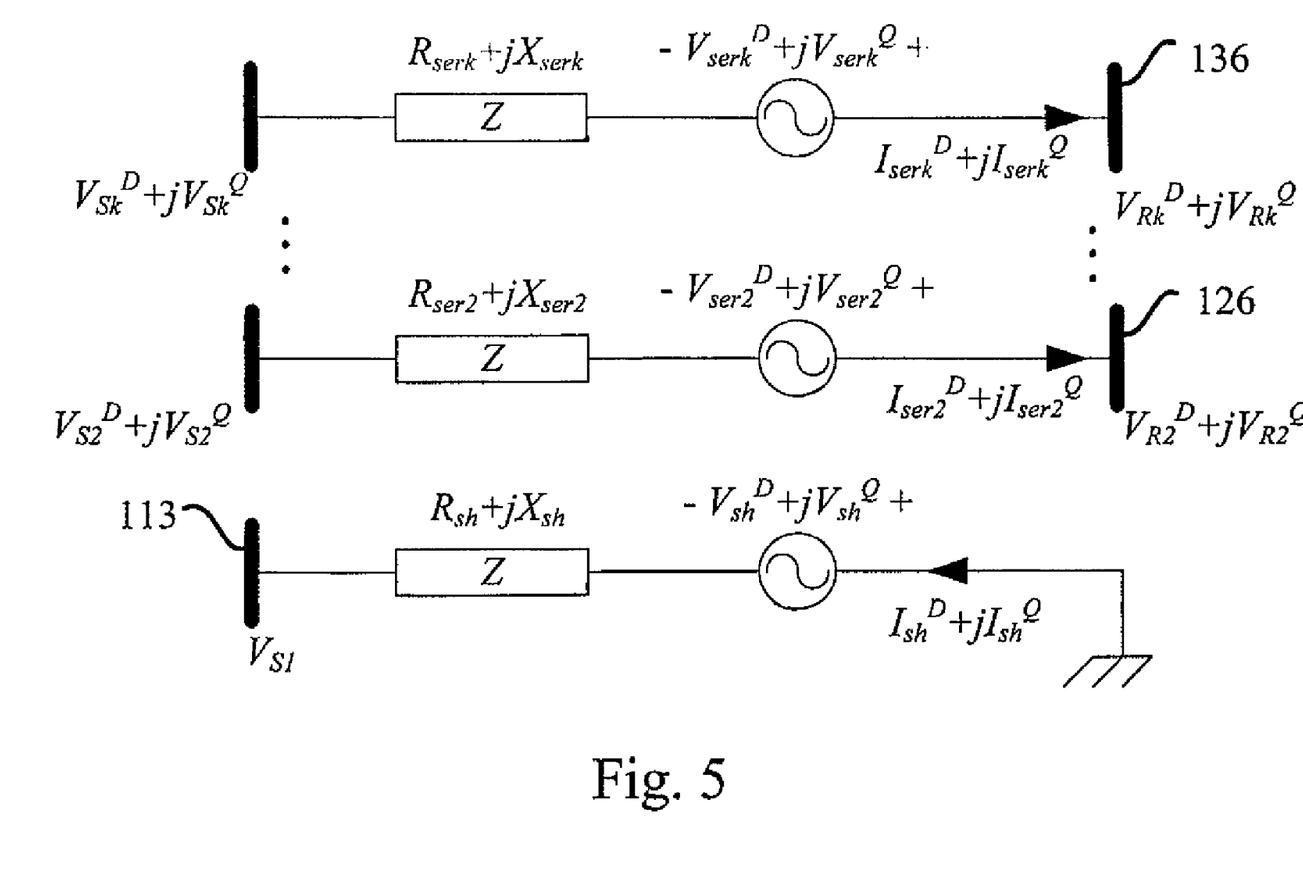
FIG. 5 is an equivalent circuit of a generalized power flow controller according to the present invention.

The equivalent circuit of the generalized power flow controller according to the present invention is derived next. As shown in FIG. 5 the equivalent circuit includes one shunt branch and a plurality of series branches. Each branch comprises an equivalent voltage source in series with an impedance, wherein the equivalent voltage source models the VSC, and the impedance models the coupling transformer. The operation of these equivalent voltage sources is dependent on each other. An active power balance equation, which will be derived later, must be satisfied to conform the energy conservation law.

The distinct feature of the present invention is expressing the control variables of the equivalent circuit in a rectangular coordinate. These variables are decomposed into d-q components by an orthogonal projection technique. For each generalized power flow controller, the voltage of the bus connecting the shunt branch is chosen as a reference phasor. The d component is in phase with the reference phasor, whereas the q component leads the reference phasor by 90 degree. For examples, the d-q decomposition on a voltage phasor, $V_{xk}=|V_{xk}|\angle\theta_{xk}$, is expressed as:

$$V_{xk}^D=|V_{rk}|\cos(\theta_{rk}-\theta_{s1}); V_{xk}^Q=|V_{rk}|\sin(\theta_{rk}-\theta_{s1}) \quad \text{eq. (1)}$$

where $\theta_{s1}$ the phase angle of the voltage at the AC bus $s_1$ 113. The superscripts "D" and "Q" symbolize the d-q components of the corresponding variables, and subscript "k" is the index of the VSC. The subscript "x" can be replaced with "s", "r", "sh" or "ser" to represent variables related to the sending-end, receiving-end, shunt branch and series branch, respectively. The d-q decomposition of a current phasor can be performed in a similar way.

The steady-state model of the generalized power flow controller can be incorporated into a Newton-Raphson power flow algorithm by replacing the generalized power flow controller with equivalent loads at the ends connected with the power grid. By the definition of the complex power, the equivalent load of the shunt branch is:

$$\begin{bmatrix} P_{s1} \\ Q_{s1} \end{bmatrix} = \begin{bmatrix} |V_{s1}| & 0 \\ 0 & -|V_{s1}| \end{bmatrix} \begin{bmatrix} I_{sh}^D \\ I_{sh}^Q \end{bmatrix}, \quad \text{eq. (2)}$$

where $I_{sh}^D$ and $I_{sh}^Q$ are the d-q current components of the shunt branch. The equivalent load at the receiving-end of each series branch is set to achieve a power flow control objective as:

$$\begin{bmatrix} P_{rk} \\ Q_{rk} \end{bmatrix} = -\begin{bmatrix} P_{linek}^{ref} \\ Q_{linek}^{ref} \end{bmatrix}, \quad k=2,\Lambda,n, \qquad \text{eq. (3)}$$

where n is the total number of VSCs, and $p_{lineck}^{ref}$ and $Q_{linek}^{ref}$ are the reference commands of the active and reactive power from the receiving-end of the kth series branch toward the connected transmission line. The equivalent load at the sending-end of the kth series branch is:

$$\begin{bmatrix} P_{sk} \\ Q_{sk} \end{bmatrix} = -\begin{bmatrix} V_{sk}^D & V_{sk}^Q \\ V_{sk}^Q & -V_{sk}^D \end{bmatrix} \begin{bmatrix} I_{serk}^D \\ I_{serk}^Q \end{bmatrix}, \quad k=2,\Lambda,n, \qquad \text{eq. (4)}$$

where $I_{serk}^D$ and $I_{serk}^Q$ are the d-q current components of the kth series branch, which can be obtained explicitly as:

$$\begin{bmatrix} I_{serk}^D \\ I_{serk}^Q \end{bmatrix} = -\frac{1}{V_{rk}^2} \begin{bmatrix} V_{rk}^D & V_{rk}^Q \\ V_{rk}^Q & -V_{rk}^D \end{bmatrix} \begin{bmatrix} P_{rk} \\ Q_{rk} \end{bmatrix}.$$

Balancing the active power transfer among the VSCs is a main function of the $VSC_1$ 111. The remaining capacity of the $VSC_1$ 111 can provide the reactive power compensation to regulate the voltage magnitude of the connected bus at a fixed level. Therefore, the voltage magnitude at the bus connecting the shunt branch can be set to achieve a voltage magnitude control objective:

$$|V_{s1}|=V_{s1}^{ref}, \qquad (5)$$

where $V_{s1}^{ref}$ is the desired voltage magnitude at the bus $s_1$.

Under the lossless assumption of the VSCs, the sum of the active power generated by the VSCs must equal zero. Therefore, the active power generated by the VSCs must be constrained by an active power balance equation:

$$P_{dc} = P_{sh} + \sum_{k=2}^{n} P_{serk} = 0, \qquad \text{eq. (6)}$$

where $P_{sh}$ is the active power generated from the equivalent voltage source of the shunt branch, and $P_{serk}$ is the active power generated from the equivalent voltage source of the kth series branch.

After simple algebra manipulations, $P_{sh}$, and $P_{serk}$, can be expressed as:

$$P_{sh}=I_{sh}^D V_{S1}^D+(I_{sh}^{D2}+I_{sh}^{Q2})R_{sh}$$

$$P_{serk}=I_{serk}^D(V_{rk}^D-V_{sk}^D)+I_{serk}^Q(V_{rk}^Q-V_{sk}^Q)+(I_{serk}^{D2}+I_{serk}^{Q2})R_{serk}$$

Each of STATCOM 103, UPFC 102, GUPFC 101 and the generalized power flow controller has different numbers of series VSCs. However, they are in common by having one shunt VSC. Consequently, UPFC 102, STATCOM 103 and GUPFC 101 can be regarded as a subdevice of the generalized power flow controller. For example, if the shunt branch and series branches share the same sending-end bus, ie. bus $s_1$, $s_2$ and $s_n$ connected together, the foregoing derivations can be applied to the GUPFC 101. Similarly, UPFC 102 has only one series branch, set n=2 in Eq (6) in a UPFC application. Furthermore, because the STATCOM 103 has no series branch, the summation part of Eq (6) is omitted, ie. Eq. (6) becomes $P_{dc}=P_{sh}$, in a STATCOM 103 application.

In the present invention, regardless of the number of the series VSCs, and whether the shunt branch and the series branch share the same sending-end or not, the power flow solution can be found under the same procedures. That is, the present invention can be utilized to calculate the power flow solution of a power grid embedded with STATCOM 103, UPFC 102, GUPFC 101 and the generalized power flow controller.

The power flow solution can be obtained by solving power flow equations, which are a set of nonlinear equations describing the power balance at each bus of a power grid. The Newton-Raphson power flow algorithm is an iterative procedure to solve power flow equations. The iterative formula of the algorithm is expressed as:

$$x^{(i+1)}=x^{(i)}-[J(x^{(i)})]^{-1}f(x^{(i)}), \qquad \text{eq. (7)}$$

where x is a state vector, f(x) is a mismatch vector, and i means the ith iteration. The elements of the state vector are called state variables which include the voltage magnitudes and the phase angles of the buses of a power grid. The elements of the mismatch vector include the net active and reactive power flowing into each bus and the other constraints of the power system. J is a corresponding Jacobian matrix which is formed by the first-order partial derivatives of the mismatch vector. After considering the equivalent loads of the generalized power flow controller, the mismatch vector is modified as:

$$f'=f+\Delta f_{GUPFC}, \qquad \text{eq. (8)}$$

where $\Delta f_{GUPFC}=[\Delta f_{bus}|\Delta f_{control}]^T=[P_{s1}Q_{s1}P_{sk}Q_{sk}P_{rk}Q_{rk}|P_{dc}]^T$, The first part of $\Delta f_{GUPFC}$, $\Delta f_{bus}$ relates to the equivalent loads at the ends of the generalized power flow controller. The elements of $\Delta f_{bus}$, are added to the corresponding position of f. The second part of $\Delta f_{GUPFC}$, $\Delta f_{control}$ is the added constraints introduced by the generalized power flow controller. The element of $\Delta f_{control}$ augments the size of the mismatch vector. Therefore, the length of f' is longer than that of f by 1. The elements of $\Delta f_{GUPFC}$ have been derived in eq. (2), (3), (4) and (6).

With regard to the state vector of the iteration formula, instead of selecting the voltage magnitudes and phase angles as state variables, the d-q current components of the shunt branch have been chosen as state variables. Hence, elements of the state vector associated with the generalized power flow controller are expressed as:

$$x_{GUPFC}=[x_{bus}|x_{control}]^T=[\theta_{s1}\theta_{sk}|V_{sk}|\theta_{rk}|V_{rk}||I_{sh}^D I_{sh}^Q]^T, \qquad \text{eq. (9)}$$

where $x_{bus}$ consists of the original state variables relevant to the generalized power flow controller, and $x_{control}$ consists of the added state variables introduced by the generalized power flow controller. Because $|V_{s1}|$ is regulated by $I_{sh}^Q$ at a fixed voltage level, $|V_{s1}|$ has been omitted from $x_{bus}$. The elements of $x_{control}$ augment the size of the original state vector. Thus, one element is omitted, and two new elements are appended to the state vector. The length of the state vector is increased by one after embedding the generalized power flow controller. The Jacobian matrix is also modified according to the first-order partial derivatives of f' as:

$$J' = J + \Delta J_{GUPFC},$$ Eq. (10)

where $$\Delta J_{GUPFC} = \begin{bmatrix} 0 & 0 & 0 & 0 & 0 & | & \frac{\partial P_{s1}}{\partial I_{sh}^D} & \frac{\partial P_{s1}}{\partial I_{sh}^Q} \\ 0 & 0 & 0 & 0 & 0 & | & \frac{\partial Q_{s1}}{\partial I_{sh}^D} & \frac{\partial Q_{s1}}{\partial I_{sh}^Q} \\ \frac{\partial P_{sk}}{\partial \theta_{s1}} & \frac{\partial P_{sk}}{\partial \theta_{sk}} & \frac{\partial P_{sk}}{\partial V_{sk}} & \frac{\partial P_{sk}}{\partial \theta_{rk}} & \frac{\partial P_{sk}}{\partial V_{rk}} & | & 0 & 0 \\ \frac{\partial Q_{sk}}{\partial \theta_{s1}} & \frac{\partial Q_{sk}}{\partial \theta_{sk}} & \frac{\partial Q_{sk}}{\partial V_{sk}} & \frac{\partial Q_{sk}}{\partial \theta_{rk}} & \frac{\partial Q_{sk}}{\partial V_{rk}} & | & 0 & 0 \\ 0 & 0 & 0 & 0 & 0 & | & 0 & 0 \\ 0 & 0 & 0 & 0 & 0 & | & 0 & 0 \\ - & - & - & - & - & -| & - & - \\ \frac{\partial P_{dc}}{\partial \theta_{s1}} & \frac{\partial P_{dc}}{\partial \theta_{sk}} & \frac{\partial P_{dc}}{\partial V_{sk}} & \frac{\partial P_{dc}}{\partial \theta_{rk}} & \frac{\partial P_{dc}}{\partial V_{rk}} & | & \frac{\partial P_{dc}}{\partial I_{sh}^D} & \frac{\partial P_{dc}}{\partial I_{sh}^Q} \end{bmatrix}$$

The upper left part of $\Delta J_{GUPFC}$ adds to the corresponding position of the original Jacobian matrix J. The other parts of $\Delta J_{GUPFC}$ augment the size of J. Since $P_{r2}$, $Q_{r2}$, $P_{rk}$ and $Q_{rk}$ are constants, the elements of $\Delta J_{GUPFC}$ in the fifth and sixth rows are all zeros. Because the length of the mismatch vector and the state vector are both increased by one, the size of J' is bigger than J by one row and one column.

After modifying the mismatch vector and Jacobian matrix, the iterative formula for updating the state vector becomes:

$$x^{(i+1)} = x^{(i)} - [J'(x^{(i)})]^{-1} f'(x^{(i)})$$ eq. (11)

When the state vector converges within a specified tolerance, the equivalent voltage of shunt VSC can be recovered from $I_{sh}^D$ and $I_{sh}^Q$. Simple manipulations yield the d-q components of the equivalent voltage of the shunt VSC:

$$\begin{bmatrix} V_{sh}^D \\ V_{sh}^Q \end{bmatrix} = \begin{bmatrix} R_{sh} & -X_{sh} \\ X_{sh} & R_{sh} \end{bmatrix} \begin{bmatrix} I_{sh}^D \\ I_{sh}^Q \end{bmatrix} + \begin{bmatrix} |V_{s1}| \\ 0 \end{bmatrix}.$$ Eq. (12)

The equivalent voltages of the series VSCs can be calculated explicitly by:

$$\begin{bmatrix} V_{serk}^D \\ V_{serk}^Q \end{bmatrix} = \begin{bmatrix} R_{serk} & -X_{serk} \\ X_{serk} & R_{serk} \end{bmatrix} \begin{bmatrix} I_{serk}^D \\ I_{serk}^Q \end{bmatrix} + \begin{bmatrix} V_{rk}^D - V_{sk}^D \\ V_{rk}^Q - V_{sk}^Q \end{bmatrix},$$ Eq. (13)

$k = 2, \Lambda, n.$

Finally, the polar form of the equivalent voltage of the shunt VSC and the series VSC can be obtained by:

$$|V_{sh}| \angle \theta_{sh} = \sqrt{V_{sh}^{D2} + V_{sh}^{Q2}} \angle \left( \tan^{-1} \frac{V_{sh}^Q}{V_{sh}^D} + \theta_{s1} \right)$$ Eq. (14)

$$|V_{serk}| \angle \theta_{serk} = \sqrt{V_{serk}^{D2} + V_{serk}^{Q2}} \angle \left( \tan^{-1} \frac{V_{serk}^Q}{V_{serk}^D} + \theta_{s1} \right)$$ Eq. (15)

Figure 6:
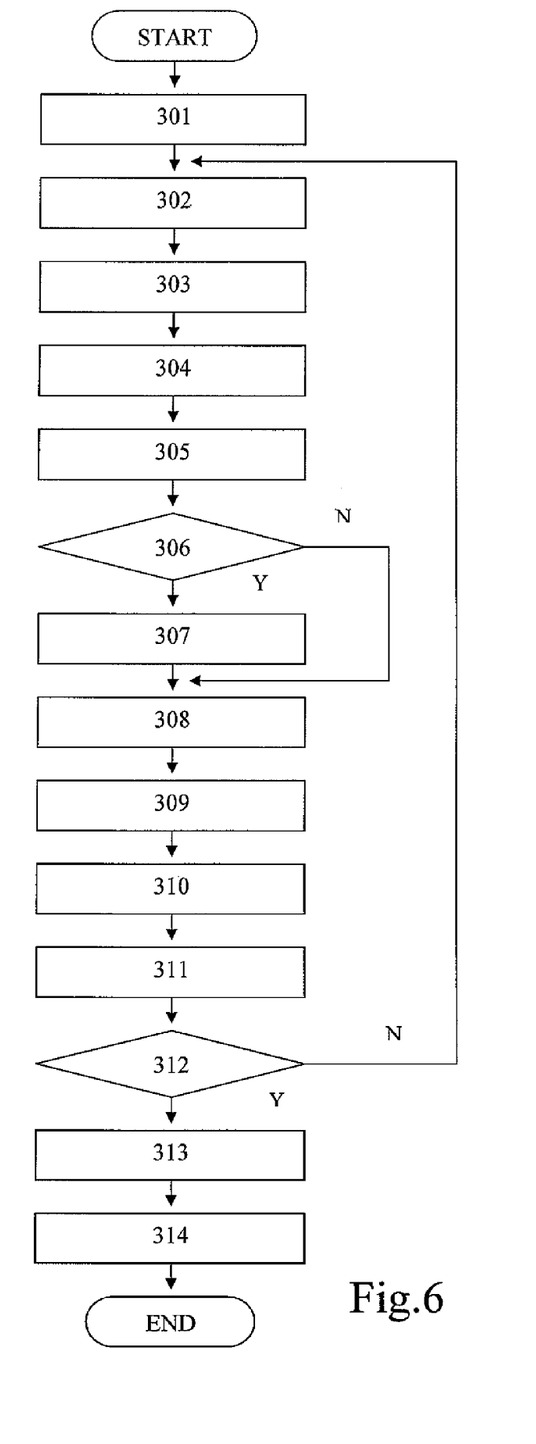
FIG. 6 is a flow chart for finding the power flow solution of a power grid embedded with the generalized power flow controller according to the present invention.

Under the assumption of known generations and loads, the basic power flow solutions, including voltages of all buses in the power grid and the equivalent voltages of the shunt and the series VSCs of the generalized power flow controller, can be found by using the disclosed method, and the detail power flow solutions, including the active and reactive power flows into each transmission line and the reactive power output of each generator, can be determined by using the basic power flow solution together with the fundamental circuit theory. A summary of procedures to calculate the power flow solution of a power grid embedded with the generalized power flow controller is depicted in FIG. 6.

Step 301: set the initial value of the state vector, wherein the elements of the state vector, called state variables, comprises the voltage magnitudes of all buses excluding the bus connected to the shunt branch of the generalized power flow controller, the phase angles of all buses, and the d-q components of the shunt branch current of the generalized power flow controller; wherein the voltage magnitude of each bus initially sets to 1.0 p.u.; and wherein the phase angle of each bus, the d and q components of the shunt branch current of the generalized power flow controller are all initially set to 0.

Step 302: construct the mismatch vector, f of a power grid ignoring the generalized power flow controller.

Step 303: establish the corresponding Jacobian matrix J using the first order derivatives of the mismatch vector f obtained in step 302.

Step 304: perform a d-q decomposition on the voltage of the receiving-end of each series branch by eq. (1). The d-q decomposition uses the voltage of the bus connected to the shunt branch of the generalized power flow control as a reference phasor. The d component, $V_{rk}^D$, is in phase with the reference phasor, whereas the q component, $V_{rk}^Q$, leads the reference phasor by 90 degree degrees.

Step 305: use eq. (2) to calculate the equivalent load of the shunt branch of the generalized power flow controller.

Step 306: judge whether there exists a series VSC, and if it exists, go to step 307, otherwise, go to step 308.

Step 307: calculate the equivalent loads at the sending-end and receiving-end of each series branch by using eq. (3) and eq. (4) from the 2nd to nth series branch, wherein n is the number of VSCs.

Step 308: use eq. (6) to calculate the total active power generated from VSCs, $P_{dc}$.

Step 309: modify the mismatch vector by using eq. (8).

Step 310: modify the Jacobian matrix by using eq. (10).

Step 311: substitute the modified mismatch vector and modified Jacobian matrix into eq. (11) to update the state vector.

Step 312: judge whether the state vector converges within specified tolerance. If it does not, go back to step 302. Otherwise, proceed to step 313.

Step 313: calculate the equivalent voltages of the VSCs by using eq. (14) and eq. (15).

Step 314: calculate the power flow solution, which includes the voltage of each bus, the active and reactive power flow of each transmission line, and the reactive power generated from each generator.

Simulating several test systems embedded with STATCOM 103, UPFC 102, GUPFC 101 and the generalized power flow controller have been performed to validate the present invention. The descriptions of the test systems are as follows:

Case 1: IEEE 300-bus test system without installing FACTS controller, referred to as a base case. This case provides a comparison basis with other cases.

Case 2: Similar to Case 1, except that it has been installed with one additional GUPFC 101. The GUPFC 101 has one shunt branch and three series branches. The shunt branch is in parallel with bus 37 to control its voltage magnitude. The series branches are in series with line 37-49 (the transmission line linking bus 37 and bus 49), line 37-89 and line 37-40, respectively, to control their active and reactive power flow.

Case 3: Similar to Case 2, except that it has been installed with one additional generalized power flow controller, referred to as GPFC. GPFC has one shunt branch and two series branches. The shunt branches in parallel with bus 102 to control its voltage magnitude. The series branches are in series with line 102-104 and line 103-105, respectively, to control their active and reactive power flow.

Case 4: Similar to Case 3, except that it has been installed with one additional UPFC 102. The UPFC 102 has one shunt branch and one series branch. The shunt branch is in parallel with bus 7 to control its voltage magnitude. The series branch is in series with line 7-131 to control its active and reactive power.

Case 5: Similar to Case 4, except that it has been installed with one additional STATCOM 103. The STATCOM 103 has one shunt branch, and it is in parallel with bus 81 to control its voltage magnitude.

In the above test cases, the coupling transformers have the same impedances as 0.01+j0.05 p.u. The allowable tolerance of Newton-Raphson algorithm is set to $10^{-12}$. The initial values for the state variables are $1\angle 0°$ for the bus voltages, and 0 for $I_{sh}^D$ and $I_{sh}^Q$. Table 1 shows the iteration numbers required for obtaining the power flow solution in different test systems. The simulation results showed that incorporating the steady-state model of the generalized power flow controller will not increase the iteration number for obtaining the power flow solution within the same allowable tolerance.

TABLE 1

Iteration numbers required for obtaining power flow solution in the different test systems

| | Case | | | | |
|---|---|---|---|---|---|
| | 1 | 2 | 3 | 4 | 5 |
| Iteration numbers | 6 | 6 | 6 | 6 | 6 |

Figure 7:
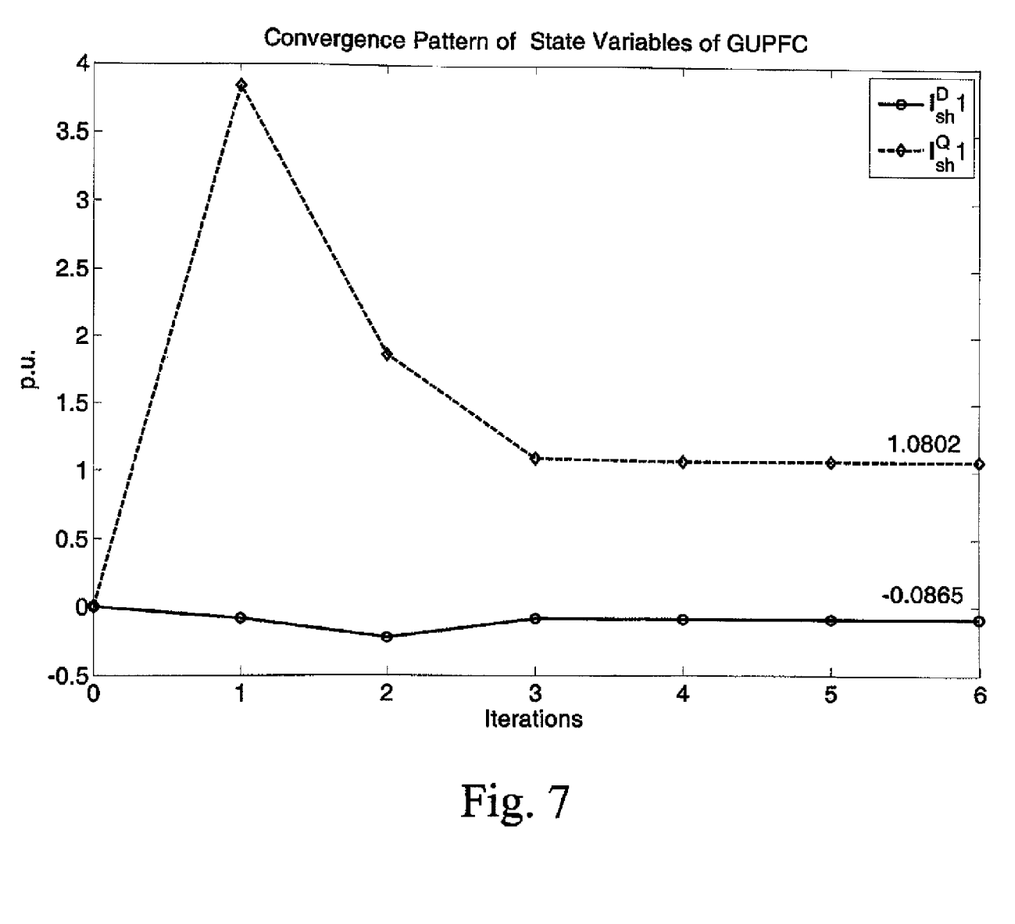
FIG. 7 shows the progress of control variables of the generalized power flow controller at each iteration according to the present invention.

FIG. 7 shows the convergence pattern of state variables of the GUPFC. As shown, the current components $I_{sh}^Q$ and $I_{sh}^D$ converge to their target values after six iterations, respectively.

Figure 8:
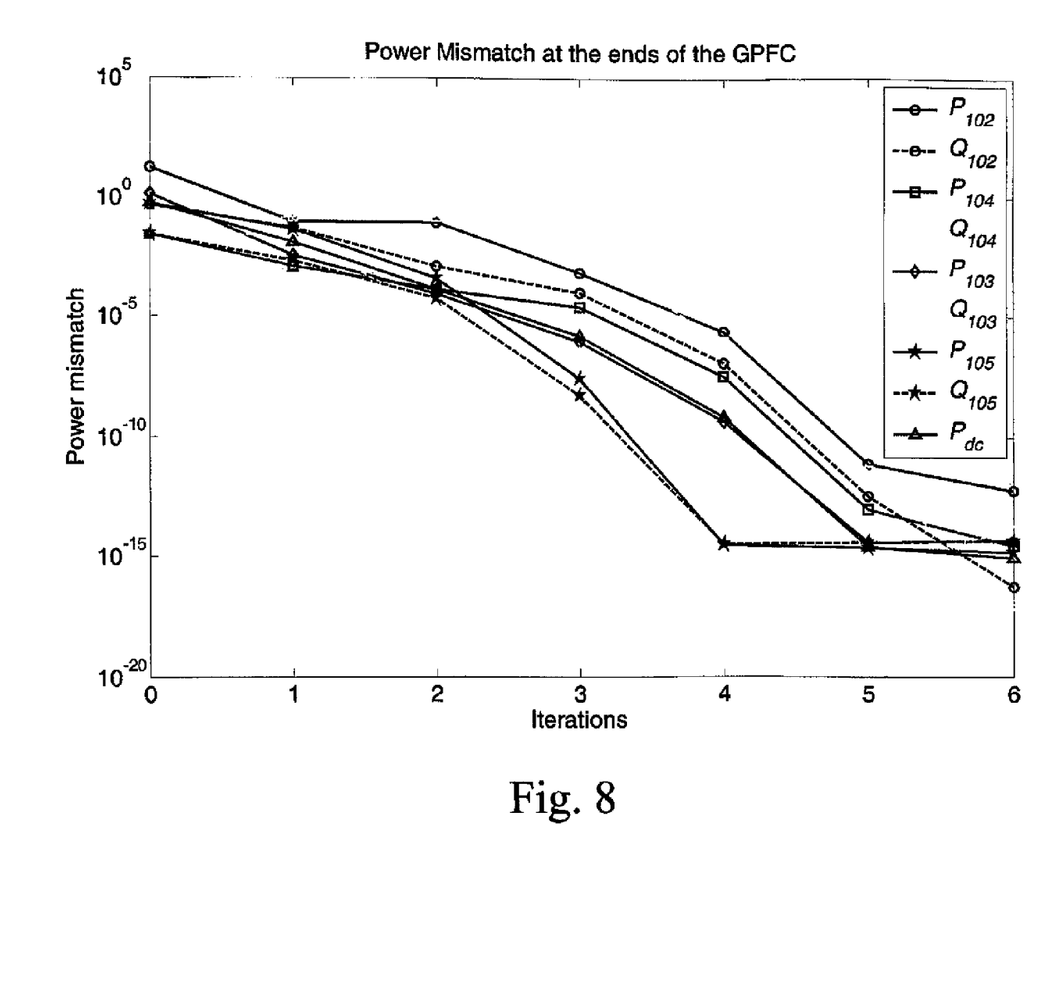
FIG. 8 shows power mismatches of buses of the generalized power flow controller at each iteration according to the present invention.

Case 3 is designed to demonstrate a distinguishing feature of the present invention. Even through the sending-ends of the shunt branch and series branches of the GPFC connect to different buses, the power flow solution converges as rapidly as the base case does. FIG. 8 shows the power mismatches at the sending-end and receiving-end buses of the GPFC. After six iterations, the power mismatches are within a tight tolerance, and, thus, a precise power flow solution is obtained. Therefore, it is well demonstrated that the power flow calculation achieves a rapid convergence characteristic using the steady state model of the generalized power flow controller according to the present invention.

Figure 9:
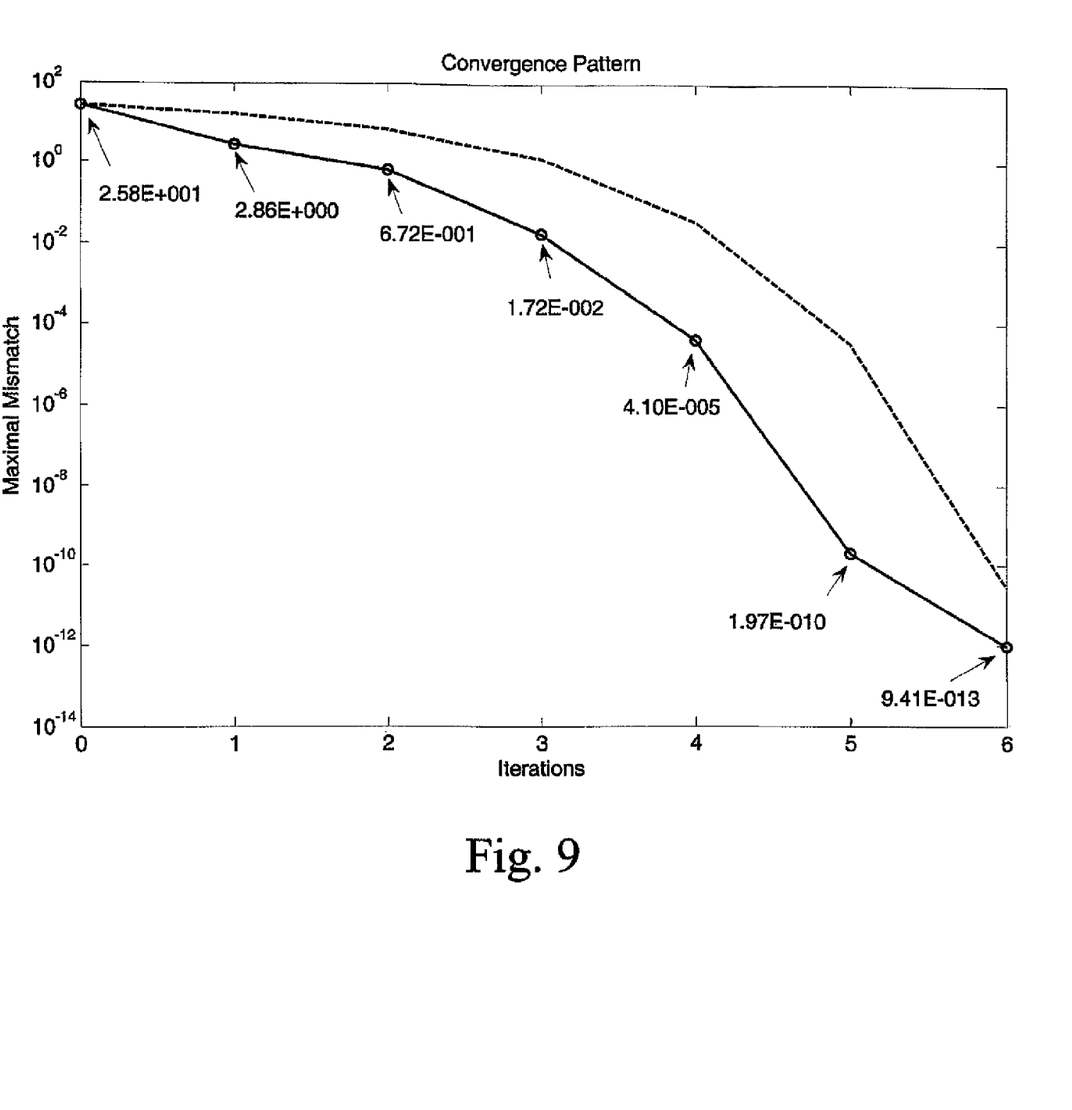
FIG. 9 shows a quadratic convergence pattern of the solution process according to the present invention.

FIG. 9 shows a quadratic convergence pattern of the solution process of Case 4, in which the dotted line is a typical quadratic convergence pattern, and the solid line is the convergence curve of Case 4. It reveals that the quadratic convergence characteristic is preserved after embedding one STATCOM 103, one UPFC 102, one GUPFC 101 and one generalized power controller into a power grid.

According to the simulation results, the power flow solution of the test cases, installed with STATCOM 103, UPFC 102, GUPFC 101 and the generalized power flow controller, can converge as rapidly as the base case does. It concludes that incorporating the steady-state model of the generalized power flow controller will not degrade the convergence speed of the Newton-Raphson algorithm.

Many changes and modifications in the above described embodiments of the invention can, of course, be carried out without departing from the scope thereof. Accordingly, to promote the progress in science and the useful arts, the invention is disclosed and is intended to be limited only by the scope of the appended claims.

What is claimed is:

1. A method for a power grid, with the power grid comprising a plurality of buses, a plurality of transmission lines, a plurality of generators, a plurality of loads, and at least one generalized power flow controller;

the at least one generalized power flow controller having one shunt branch and a plurality of series branches;

the shunt branch having a sending-end connecting in parallel with a bus of the power grid, with the shunt branch comprising a shunt voltage sourced converter and a shunt coupling transformer and being modeled by an equivalent shunt voltage source in series with an impedance;

each of the plurality of series branches having a sending-end and a receiving end, with each of the plurality of series branches connecting in series with a transmission line of the power grid, with each of the plurality of series branches comprising a series voltage sourced converter and a series coupling transformer and being modeled by an equivalent series voltage source in series with an impedance;

the AC side of the shunt voltage sourced converter connecting to the power grid through the shunt coupling transformer, and the AC side of each of the series voltage converter connecting to the power grid through the series coupling transformer; the DC sides of the shunt voltage sourced converter and the series voltage sourced converters jointly connecting to a DC capacitor to share the same DC bus;

the method comprising:

expressing a variable related to the generalized power flow controller in d-q components, wherein the d component is in phase with a reference phasor, and the q component leads the reference phasor by 90 degrees;

the method further comprising:

(A) setting initial values of the state vector, wherein the state vector comprises the voltage magnitudes of all buses excluding the bus connected to the shunt branch of the generalized power flow controller, the phase angles of all buses, and the d-q components of the shunt branch current of the generalized power flow controller;

(B) constructing the mismatch vector of the power grid ignoring the generalized power flow controller;

(C) establishing the corresponding Jacobian matrix using the first order derivatives of the mismatch vector obtained in (B);

(D) performing a d-q decomposition on the voltage of the receiving-end of each series branch;

(E) calculating the equivalent load of the shunt branch;

(F) judging whether there exists a series voltage sourced converter, and if it exists, go to (G), otherwise, go to (H);

(G) calculating the equivalent loads at the sending-end and receiving-end of each series branch, from the $2^{nd}$ to $n^{th}$ series branch, wherein n is the number of the voltage sourced converters;

(H) calculating the total active power generated from voltage sourced converters;

(I) modifying the mismatch vector according to the equivalent load of the shunt branch, the equivalent loads of each of the series branch, and the total active power generated from the voltage sourced converters;

(J) modifying the Jacobian matrix using the first order derivatives of the modified mismatch vector obtained in (I);

(K) substituting the modified mismatch vector obtained in (I) and the modified Jacobian matrix obtained in (J) into the iterative formula of Newton Raphson algorithm to update the state vector;

(L) judging whether the state vector converges within specified tolerance, and if it does not, go back to (B), otherwise, proceed to (M);

(M) calculating the equivalent voltages of the shunt converter and series converters;

(N) calculating a power flow solution according to the state vector and the equivalent voltages of the shunt converter and series converters, with the power flow solution the voltage of each bus, the active and reactive power flow of each transmission line, the reactive power generated from each generator and the equivalent voltages of the voltage sourced converters of each generalized power flow controller, with the power flow solution providing information of impacts on the power grid after installing the at least one generalized power flow controller;

(O) using the shunt branch to regulate the voltage magnitude of the bus connected to the shunt branch; and (P) controlling the active and reactive power of the transmission line connected with the plurality of series branches.

2. A method in accordance with claim 1, wherein the voltage magnitude of each bus initially sets to 1.0 p.u., the phase angle of each bus, the d and q components of the shunt branch current of the generalized power flow controller all initially set to 0.

3. A method in accordance with claim 1, wherein the d-q decomposition uses the voltage of the bus connected to the shunt branch of the generalized power flow control as a reference phasor.

4. A method in accordance with claim 1, wherein the sending-ends of the shunt branch and series branches connect to a common bus.

5. A method in accordance with claim 4, wherein the number of the voltage sourced converters is 2.

6. A method in accordance with claim 1, wherein the sending-ends of the shunt branch and series branches connect to different buses.

* * * * *